United States Patent
Ogino et al.

(10) Patent No.: US 7,366,629 B2
(45) Date of Patent: *Apr. 29, 2008

(54) HIGH FREQUENCY MODULE BOARD DEVICE

(75) Inventors: Tatsuya Ogino, Kanagawa (JP); Akihiko Okubora, Kanagawa (JP); Takayuki Hirabayashi, Tokyo (JP); Takahiko Kosemura, Kanagawa (JP); Kuniyuki Hayashi, Oita (JP)

(73) Assignee: Sony Corporation, Tokyo (JP)

( * ) Notice: Subject to any disclaimer, the term of this patent is extended or adjusted under 35 U.S.C. 154(b) by 301 days.

This patent is subject to a terminal disclaimer.

(21) Appl. No.: 11/104,039

(22) Filed: Apr. 12, 2005

(65) Prior Publication Data

US 2005/0195891 A1    Sep. 8, 2005

Related U.S. Application Data

(63) Continuation of application No. 10/416,683, filed as application No. PCT/JP02/10334 on Oct. 3, 2002, now Pat. No. 6,889,155.

(30) Foreign Application Priority Data

Oct. 5, 2001    (JP)  ............................. 2001-310369

(51) Int. Cl.
*G06F 17/50*    (2006.01)
*G06F 17/00*    (2006.01)

(52) U.S. Cl. ...................... 702/113; 257/724; 361/761; 716/1; 716/8

(58) Field of Classification Search ................ 257/724, 257/748; 361/761, 814; 702/113; 716/1, 716/4, 5, 8

See application file for complete search history.

(56) References Cited

U.S. PATENT DOCUMENTS

| 2,648,804 | A | * | 8/1953 | Steigerwalt et al. | ........ 361/765 |
| 3,400,210 | A | * | 9/1968 | Reimer | ........ 174/266 |
| 5,382,925 | A | * | 1/1995 | Hayashi et al. | ........ 333/112 |
| 6,714,422 | B2 | * | 3/2004 | Okubora et al. | ........ 361/793 |

(Continued)

FOREIGN PATENT DOCUMENTS

JP    6-77665    3/1994

(Continued)

*Primary Examiner*—Edward R Cosimano
(74) *Attorney, Agent, or Firm*—Robert J. Depke; Rockey, Depke & Lyons, LLC.

(57) ABSTRACT

The present invention relates to a high frequency module board device having a high frequency transmitting and receiving circuit for modulating and demodulating a high frequency signal. The high frequency module board device comprises a base board (2) whose main surface is formed as a build-up surface (2a) and a high frequency circuit part (3) formed on the build-up surface of the base board (2) and having passive elements formed. The base board (2) has an area (29) in which wiring is not formed in a lower layer from a fourth wiring layer (8b). The high frequency circuit part (3) has an upper electrode part (36) and a lower electrode part (35) in positions corresponding to the area (29) in which the wiring is not formed. Thus, since a capacitance (18) is provided just above the area (29) in which the wiring is not formed, a parasitic capacity that the capacitance (18) receives from ground patterns (14) is reduced. Accordingly, the characteristics of the capacitance (18) can be improved.

3 Claims, 12 Drawing Sheets

U.S. PATENT DOCUMENTS

| | | | |
|---|---|---|---|
| 6,797,890 B2* | 9/2004 | Okubora et al. | 174/260 |
| 6,800,936 B2* | 10/2004 | Kosemura et al. | 257/748 |
| 6,889,155 B2* | 5/2005 | Ogino et al. | 702/113 |
| 6,917,259 B2* | 7/2005 | Hirabayashi | 333/105 |
| 7,064,630 B2* | 6/2006 | Hirabayashi et al. | 333/204 |
| 2002/0075106 A1* | 6/2002 | Okubora et al. | 333/247 |
| 2002/0132096 A1* | 9/2002 | Takeuchi et al. | 428/210 |
| 2002/0195270 A1* | 12/2002 | Okubora et al. | 174/260 |
| 2003/0148739 A1* | 8/2003 | Kosemura et al. | 455/73 |
| 2003/0151477 A1* | 8/2003 | Hirabayashi et al. | 333/247 |
| 2004/0034489 A1* | 2/2004 | Ogino et al. | 702/75 |
| 2004/0036551 A1* | 2/2004 | Hirabayashi | 333/101 |
| 2004/0130877 A1* | 7/2004 | Okubora | 361/793 |
| 2004/0155734 A1* | 8/2004 | Kosemura et al. | 333/246 |
| 2005/0037535 A1* | 2/2005 | Ogawa et al. | 438/106 |
| 2005/0146403 A1* | 7/2005 | Okubora | 333/247 |

FOREIGN PATENT DOCUMENTS

| | | | |
|---|---|---|---|
| JP | 10-322029 | | 12/1998 |
| JP | 2000-189937 | * | 6/2000 |
| JP | 2001-077315 | | 3/2001 |
| JP | 2001-196856 | | 7/2001 |
| JP | 2001-313469 | | 11/2001 |
| JP | 2002-43841 | | 2/2002 |
| WO | WO 03/032386 A1 | * | 4/2003 |

* cited by examiner

PRIOR ART

PRIOR ART

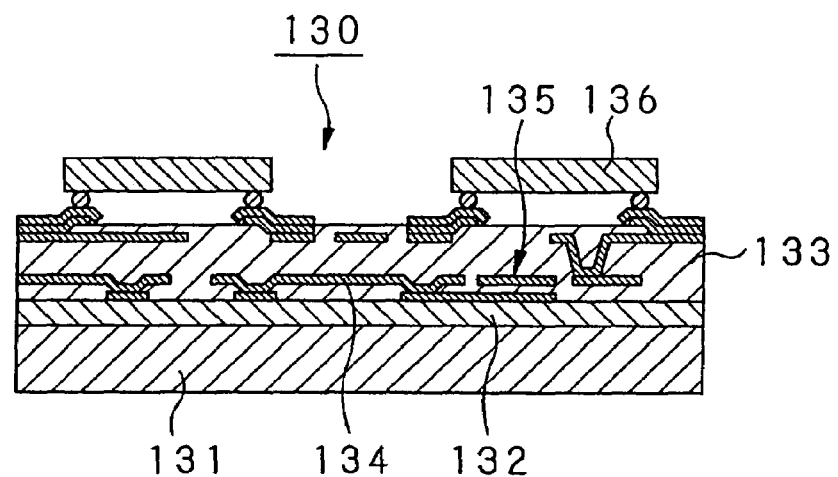
PRIOR ART  FIG.4
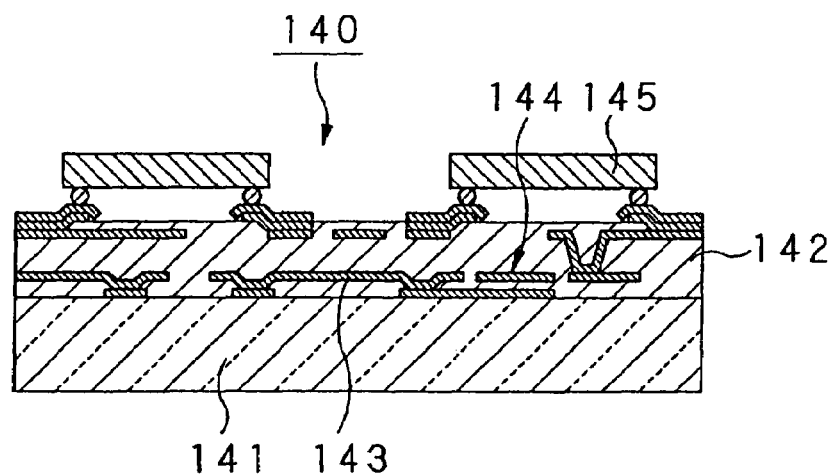
PRIOR ART  FIG.5

PRIOR ART

HIGH FREQUENCY MODULE BOARD DEVICE

The subject matter of application Ser. No. 10/416,683, now U.S. Pat. No. 6,889,155, is incorporated herein by reference. The present application is a continuation of U.S. application Ser. No. 10/416,683, filed Sep. 15, 2003, now U.S. Pat. No. 6,889,155, which claims priority to Japanese Patent Application No. JP2001-310369, filed Oct. 5, 2001, and WIPO Patent Application No. PCT/JP02/10334, filed Oct. 3, 2002. The present application claims priority to these previously filed applications.

TECHNICAL FIELD

Background Art

Various kinds of information such as music, audio data, images or the like can be readily treated by compact information processors such as personal computers or mobile computers with the digitization of data. The band of these information has been compressed by an audio codec technique or an image codec technique. Thus, an environment in which the information is easily and efficiently distributed to various kinds of communication terminal equipment by a digital communication or a digital broadcasting has been arranged. For instance, audio data and video data (refer them to as AV data, hereinafter) may be received outdoors by portable telephones.

The transmitting and receiving system of data or the like has been conveniently utilized in small areas as well as in homes in various ways by forming preferable network systems. As the network systems, for instance, a narrow band radio communication system of a band of 5 GHz which is proposed in IEEE 802.11a, a radio LAN system of a band of 2.45 GHz which is proposed in IEEE 802.11b or a short-range radio communication system called a Bluetooth has been paid attention to.

In the transmitting and receiving systems for data, such wireless network systems may be effectively utilized to easily deliver various kinds of data in different places such as homes or outdoors without using repeaters, access to various types of communication networks, or transmit and receive data.

It is essentially necessary for the transmitting and receiving systems to realize compact, light and portable communication terminal equipment having the above-described communication function. The communication terminal equipment needs to modulate and demodulate an analog high frequency signal in a transmitting and receiving part. Accordingly, the communication terminal equipment generally has a high frequency transmitting and receiving circuit based on a super-heterodyne system in which a transmitted and received signal is temporarily converted into an intermediate frequency signal.

A high frequency transmitting and receiving circuit 100 comprises, as shown in FIG. 1, an antenna part 101 having an antenna or a change-over switch to receive or transmit an information signal, and a transmission and reception switching unit 102 for switching transmission and reception. The high frequency transmitting and receiving circuit 100 is provided with a receiving circuit part 105 including a frequency converting circuit part 103, a demodulating circuit part 104 or the like. Further, the high frequency transmitting and receiving circuit 100 is provided with a transmitting circuit part 109 including a power amplifier 106, a drive amplifier 107, a modulating circuit part 108 or the like.

Further, the high frequency transmitting and receiving circuit 100 includes a reference frequency generating circuit part for supplying a reference frequency to the receiving circuit part 105 or the transmitting circuit part 109.

The high frequency transmitting and receiving circuit 100 having the above-described structure, the detail of which is omitted, includes large functional parts such as various filters respectively inserted between stages, VCO (voltage controlled oscillator), SAW filters (surface acoustic wave filter), etc. The high frequency transmitting and receiving circuit 100 further includes many passive parts such as inductance, resistors, capacitors characteristic of high frequency analog circuits such as matching circuits or bias circuits. Therefore, the high frequency transmitting and receiving circuit 100 becomes large as a whole, so that the communication terminal equipment using this circuit 100 hardly becomes compact and light.

In the communication terminal equipment, as shown in FIG. 2, a high frequency transmitting and receiving circuit 110 based on a direct conversion system is used in which an information signal is transmitted and received without converting the information signal into an intermediate frequency. In the high frequency transmitting and receiving circuit 110, the information signal received by an antenna part 111 is supplied to a demodulating circuit part 113 through a transmission and reception switching unit 112 and a base-band process is directly carried out. In the high frequency transmitting and receiving circuit 110, the information signal generated in a source is not converted into an intermediate frequency in a modulating circuit part 114 and directly modulated into a prescribed frequency band. The modulated signal is transmitted from the antenna part 111 through an amplifier 115 and the transmission and reception switching unit 112.

The above-described high frequency transmitting and receiving circuit 110 does not convert the information signal into the intermediate frequency and carries out a direct detection to transmit and receive the information signal. Therefore the number of parts such as filters is reduced and an entire construction is simplified and a configuration substantially composed of one chip may be realized. However, the high frequency transmitting and receiving circuit 110 needs a filter or a matching circuit disposed in a post-stage. Since the high frequency transmitting and receiving circuit 110 carries out an amplifying operation once in a high frequency stage, the circuit 100 hardly obtains an adequate gain. A base-band part also needs to carry out an amplifying operation. Accordingly, the high frequency transmitting and receiving circuit 110 needs a cancellation circuit with DC offset or an excess low-pass filter, so that entirely consumed power is increased.

The conventional high frequency transmitting and receiving circuits of both the super-heterodyne system and the direct conversion system, as mentioned above, cannot obtain adequate characteristics as the transmitting and receiving circuits, in addition to the miniaturization and light-weight of the communication terminal equipment. Therefore, in the high frequency transmitting and receiving circuit, various attempts for modularizing, for instance, an Si-CMOS circuit as a base to be compact with a simple structure have been carried out. That is, as one of them, there exists a method for manufacturing what is called, a one-chip high frequency module board device. In this method, for instance, passive elements having good characteristics are formed on an Si substrate and a filter circuit or a resonator or the like are formed on an LSI, and further, the logic LSI of the base-band part is integrated.

It is important for the above-described one-chip high frequency module board device how to form the passive elements having good performance on the LSI. FIGS. 3A and 3B show a high frequency module board 120 having passive elements having high performance. This high frequency module board 120 has a large recessed part 125 corresponding to an inductor forming part 124 of an Si substrate 122 and an SiO$_2$ insulating layer 123. An inductance 121 is formed so as to cover the opening side of the recessed part 125. That is, the inductance 121 has a coil part 128 formed so as to close the opening part of the recessed part 124. A coil part 128 is connected to a first wiring layer 126 so as to protrude into the recessed part 124 and connected to a second wiring layer 127 extended on the insulating layer 123. In the high frequency module board 120 constructed as described, above, a forming step of the inductance 121 is complicated, so that the forming steps are increased to increase a manufacture cost.

In the conventional high frequency module board device, the electrical interference of the Si substrate provided between a circuit part of an analog circuit and a base-band circuit part of a digital circuit constitutes a serious problem.

As circuit board devices which overcome the above-described problems, for instance, a high frequency module board device 130 using an Si substrate as a base substrate as shown in FIG. 4 has been proposed. Further, a high frequency module board device 140 using a glass substrate as a base substrate as shown in FIG. 5 has been proposed.

In the high frequency module board device 130 shown in FIG. 4, after an SiO$_2$ layer 132 is formed on an Si substrate 131, a high frequency circuit part 133 is formed by a lithography technique. In the high frequency circuit part 133, the detail of which is omitted, for instance, capacitance, inductors, etc. as passive elements 135 are formed together with pattern wiring 134 in multi-layers by a thin film forming technique or a thick film forming technique.

In the high frequency module board device 130, terminal parts connected to the inner pattern wiring 134 through vias as through holes for relay are formed on the high frequency circuit part 133. Circuit elements 136 such as a high frequency IC, an LSI, etc. are directly mounted on these terminal parts by a flip chip mounting method. The high frequency module board device 130 is mounted on, for instance, a mother board, so that a circuit part and a base-band circuit part can be divided to suppress the electrical interference of both the circuit parts.

In the high frequency module device 130 shown in FIG. 4, the Si substrate 131 having an electric conductivity functions for forming respectively the passive elements in the high frequency circuit part 133. However, this substrate undesirably constitutes a factor of interference upon realizing the good high frequency characteristics of the respective passive elements.

On the other hand, the high frequency module board device 140 shown in FIG. 5 uses a glass substrate 141 as a base substrate in order to solve the problems of the Si substrate 131 forming the high frequency module board device 130 shown in FIG. 4. In the high frequency module board device 140, a circuit part 142 is formed on the glass substrate 141 by the lithography technique. In the high frequency circuit part 142, the detail of which is omitted, capacitance, inductance, etc. as passive elements 144 are formed together with pattern wiring 143 in multi-layers by the thin film forming technique or the thick film forming technique.

In the high frequency module board device 140 shown in FIG. 5, terminal parts connected to the inner pattern wiring through vias or the like are formed on the high frequency circuit part 142. Circuit elements 145 such as a high frequency IC, LSI, etc. are directly mounted on these terminal parts by a flip chip mounting method. In this high frequency module board device 140, the glass substrate 141 having no electric conductivity is used to suppress a capacity coupling between the glass substrate 141 and the high frequency circuit part 142. Thus, the passive elements having good high frequency characteristics can be formed in the high frequency circuit part 142.

In the above-described high frequency module board devices 130 and 140, a pattern of a high frequency signal system is formed through a wiring layer formed on the above-described Si substrate 131 or the glass substrate 141. Further, supply wiring or signal wiring for a control system such as a power source, a ground, etc. are formed through the wiring layer. Therefore, in these high frequency module board devices 130 and 140, an electrical interference is generated respectively between the wiring. Further, since the wiring layers are formed in multi-layers, a manufacture cost is increased. The wiring patterns are pulled around to cause the devices themselves to be enlarged.

In the high frequency module board device 130, a package 150 is formed to be mounted on an interposer board 151 as shown in FIG. 6. The package 150 serves to mount the high frequency module board device 130 on one surface of the interposer board 151 and is entirely encapsulated with an insulating resin 152. In the package 150, pattern wiring 153 or input and output terminal parts 154 are respectively formed on both the front and back surfaces of the interposer board 151. Further, many electrode parts 155 are formed in the periphery of an area on which the high frequency module board device 130 is mounted.

In the package 150, while the high frequency module board device 130 is mounted on the interposer board 151, the high frequency module board device 130 is electrically connected to the electrode parts 155 by wires 156 in accordance with a wire bonding method. Thus, power can be supplied from an external power source to transmit a signal to and receive a signal from an external circuit. Consequently, in the high frequency module board device 130 shown in FIG. 4, electrodes 137 to which the pattern wiring 134 or the wires 156 are connected are formed on a surface layer on which the circuit elements 136 such as the high frequency IC, LSI, etc. are mounted. The high frequency module board device 140 shown in FIG. 5 is packaged in the same manner as described above.

These high frequency module board devices 130 and 140 are mounted on the interposer board 151 and packaged as mentioned above, however, the thickness or the area of the package 150 is inconveniently increased. Both the high frequency module board devices 130 and 140 increase the cost of the package 150.

A shield cover 157 with which the circuit elements 136 and 145 such as the high frequency IC, LSI, etc. mounted on the high frequency module board devices 130 and 140 are covered to reduce the influence of electromagnetic wave noise is attached to the package 150. Therefore, in the package 150, heat generated from the circuit elements 136, 145 or the like is stored in the shield cover 157 to deteriorate characteristics as the high frequency module board device, so that a heat radiating mechanism needs to be provided.

In such a package 150, since the Si substrate 131 or the glass substrate 141 is used in the high frequency module board devices 130 and 140, it is difficult to provide heat radiating mechanisms for radiating heat from the substrate sides to cause the devices themselves to be enlarged.

Since the relatively expensive Si substrate 131 or the glass substrate 141 is used as the base substrate to increase the cost of the high frequency module board devices, the high frequency module board devices 130 and 140 are hardly provided at low cost.

DISCLOSURE OF THE INVENTION

It is an object of the present invention to provide a new high frequency module board device in which the problems of the conventional high frequency module board device as mentioned above can be solved.

It is another object of the present invention to provide a high frequency module board device capable of further improving the characteristics of capacitance.

It is a still another object of the present invention to provide a high frequency module board device in which a device itself can be made compact and which can be provided at low cost.

A high frequency module board device according to the present invention proposed to achieve the above-described objects comprises a base board having wiring layers formed in multi-layers through insulating layers on a main surface of the base board, the main surface being formed as a build-up surface; and a high frequency circuit part having wiring layers formed in multi-layers through an insulating layer on the build-up surface of the base board and passive elements formed in the wiring layers. The base board has an area in which wiring is not formed at least on the first wiring layer counted from the build-up surface. The high frequency circuit part has a capacitance formed in such a way as described below. An upper electrode part and a lower electrode part are formed at positions respectively corresponding to the area in which the wiring is not formed in the upper and lower wiring layers adjacent to each other in the direction of height. Thus, the insulating layer is interposed between the upper electrode part and the lower electrode part just above the area in which the wiring is not formed.

The high frequency module board device according to the present invention has the capacitance formed in such a way that the insulating layer is interposed between the upper electrode part formed on the upper wiring layer and the lower electrode part formed on the lower wiring layer just above the area in which the wiring is not formed. In this high frequency module board device, the distance between the capacitance and the wiring layers of the base board can be adequately taken. Parasitic capacity generated by the wiring layers of the base board is reduced relative to the capacitance. Accordingly, the characteristics of the capacitance are improved.

Another high frequency module board device according to the present invention comprises: a base board having wiring layers formed in multi-layers through insulating layers on a main surface of the base board the main surface being formed as a build-up surface; and a high frequency circuit part having wiring layers formed in multi-layers through an insulating layer on the build-up surface of the base board and passive elements formed in the wiring layers. The base board has an area in which wiring is not formed at least on the second wiring layer counted from the build-up surface. The high frequency circuit part has a capacitance formed in such a way as described below. An upper electrode part is formed at a position corresponding to the area in which the wiring is not formed on the wiring layer of the high frequency circuit part adjacent to the build-up surface. A lower electrode part is formed at a position corresponding to the area in which the wiring is not formed on the first wiring layer counted from the build-up surface of the base board. Thus, the insulating layer is interposed between the upper electrode part and the lower electrode part just above the area in which the wiring is not formed.

This high frequency module board device has the capacitance formed in such a way that the insulating layer is interposed between the upper electrode part formed in the wiring layer of the high frequency circuit part adjacent to the build-up surface and the lower electrode part formed in the first wiring layer counted from the build-up surface of the base board, just above the area in which the wiring is not formed in the wiring layer of the base board. In this high frequency module board device, the capacitance can be adequately separated from the wiring layers of the base board. Parasitic capacity generated by the wiring layers of the base board is reduced relative to the capacitance, so that the characteristics of the capacitance are improved.

A still another high frequency module board device according to the present invention comprises: a base board having wiring layers formed in multi-layers through insulating layers on a main surface of the base board, the main surface being formed as a build-up surface; and a high frequency circuit part having wiring layers formed in multi-layers through an insulating layer on the build-up surface of the base board and passive elements formed in the wiring layers. The base board has an area in which wiring is not formed at least on the second wiring layer counted from the build-up surface. The high frequency circuit part has a first capacitance formed in such a way as described below. An upper electrode part and a lower electrode part are formed at positions respectively corresponding to the area in which the wiring is not formed on an upper wiring layer and a lower wiring layer adjacent to each other in the direction of height of the high frequency circuit part. Thus, the insulating layer is interposed between the upper electrode part and the lower electrode part just above the area in which the wiring is not formed. The high frequency circuit part has a second capacitance formed in such a way as described below. An electrode part is formed at a position corresponding to the area in which the wiring is not formed on the first wiring layer counted from the build-up surface of the base board. The electrode part is interconnected to the upper electrode part of the first capacitance so that the insulating layer is interposed between the lower electrode part of the first capacitance and the electrode part.

This high frequency module board device has the first capacitance formed in such a way that the insulating layer is interposed between the upper electrode part formed in the upper wiring layer and the lower electrode part formed in the lower wiring layer just above the area in which the wiring is not formed in the wiring layer of the base board. Further, the high frequency module board device has the second capacitance formed in such a way that the electrode part formed on the first wiring layer counted from the build-up surface of the base board is interconnected to the upper electrode part to interpose the insulating layer between the lower electrode part and the electrode part. In this high frequency module board device, the capacitance can be adequately separated from the wiring layers of the base board. Parasitic capacities generated by the wiring layers of the base board are respectively reduced relative to the capacitance, so that the characteristics of the capacitance are respectively improved.

Still other objects of the present invention and specific advantages obtained by the present invention will be more apparent from the description of embodiments made by referring to the drawings.

BRIEF DESCRIPTION OF THE DRAWINGS

FIG. 4 is a longitudinally sectional view showing a structure that uses a silicon substrate for a base board of a high frequency module board device.

FIG. 5 is a longitudinally sectional view showing a structure that uses a glass substrate for a base board of a high frequency module board device.

FIG. 9A shows the area in which the wiring is not formed in a fourth wiring layer, FIG. 9B shows the area in which the wiring is not formed in a third wiring layer, FIG. 9C shows the area in which the wiring is not formed in a second wiring layer, and FIG. 9D shows a ground pattern in a first wiring layer.

BEST MODE FOR CARRYING OUT THE INVENTION

Figure 1:
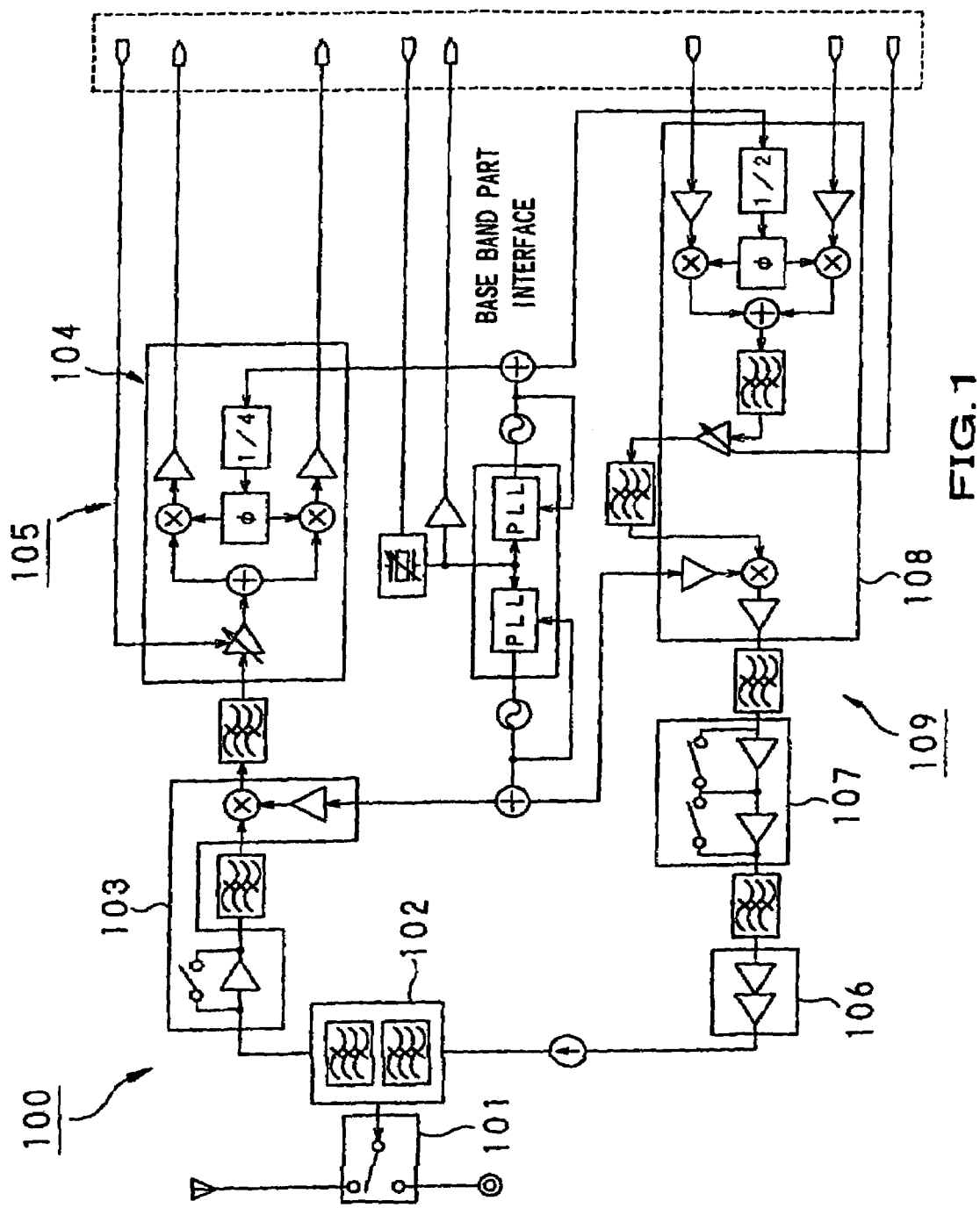
FIG. 1 is a block diagram showing a high frequency transmitting and receiving circuit using a super-heterodyne system.
Figure 2:
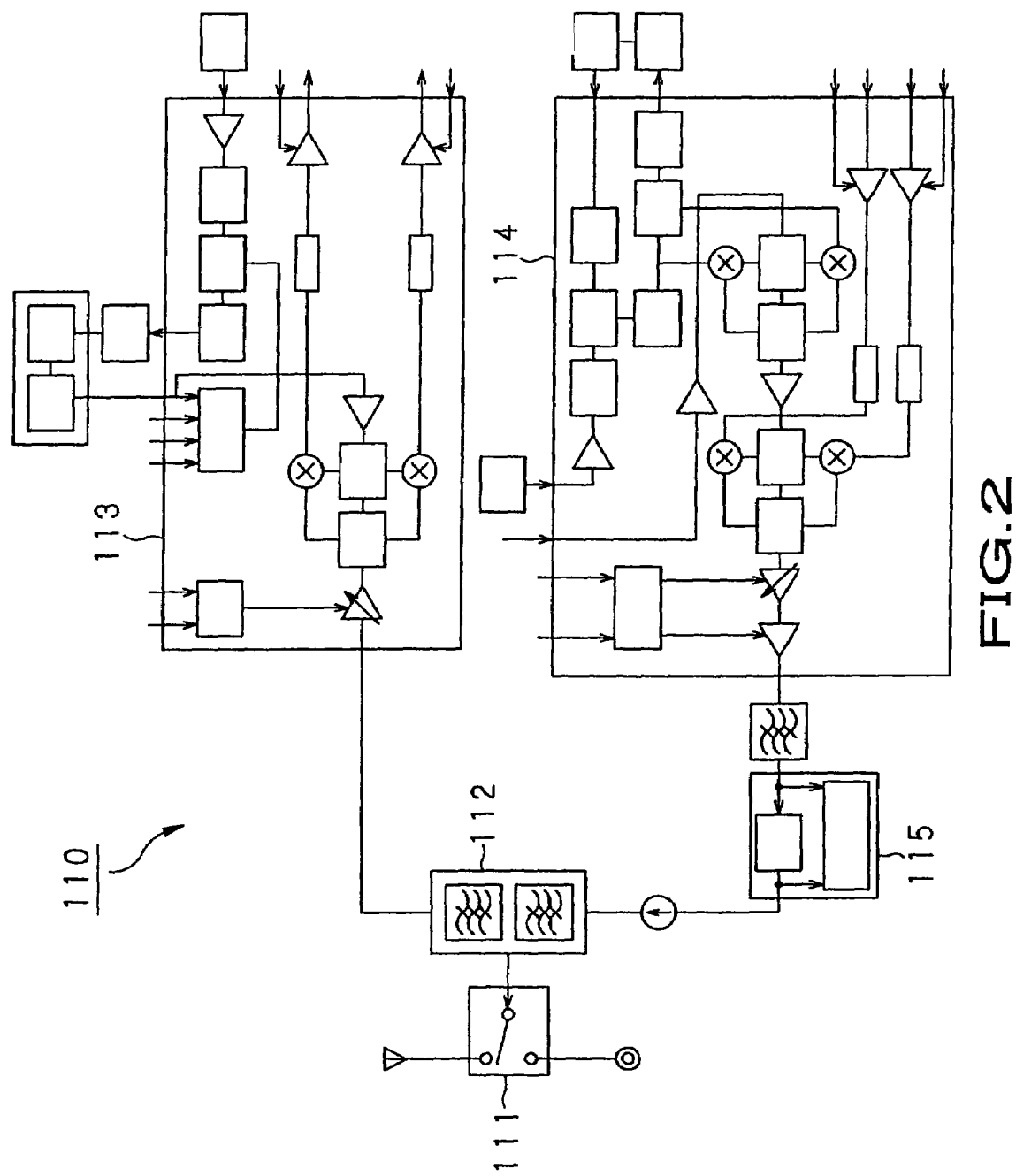
FIG. 2 is a block diagram showing a high frequency transmitting and receiving circuit using a direct conversion system.
Figure 3A:
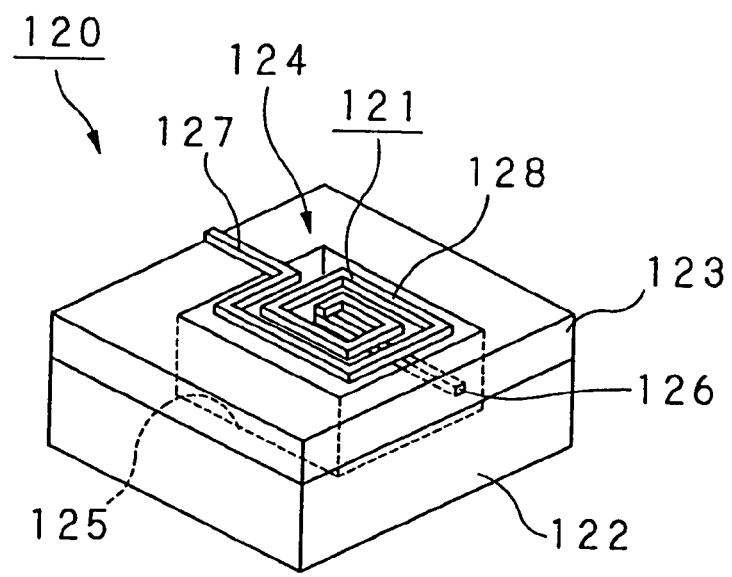
FIG. 3A is a perspective view showing an inductor provided in a conventional high frequency module board device and FIG. 3B is a longitudinally sectional view thereof.
Figure 3B:
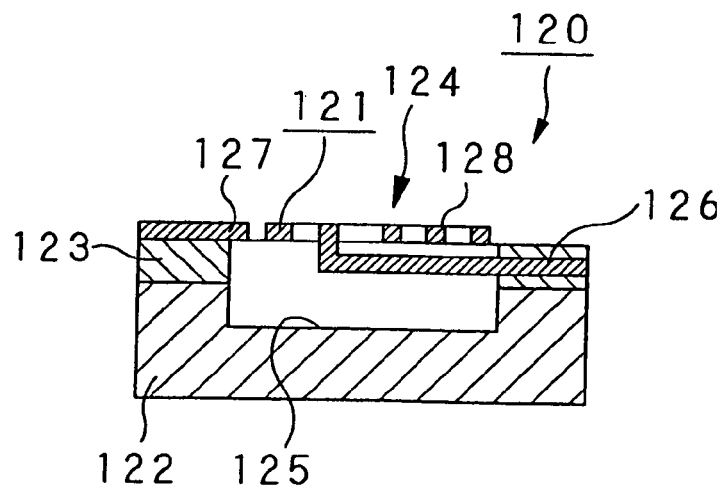
Figure 6:
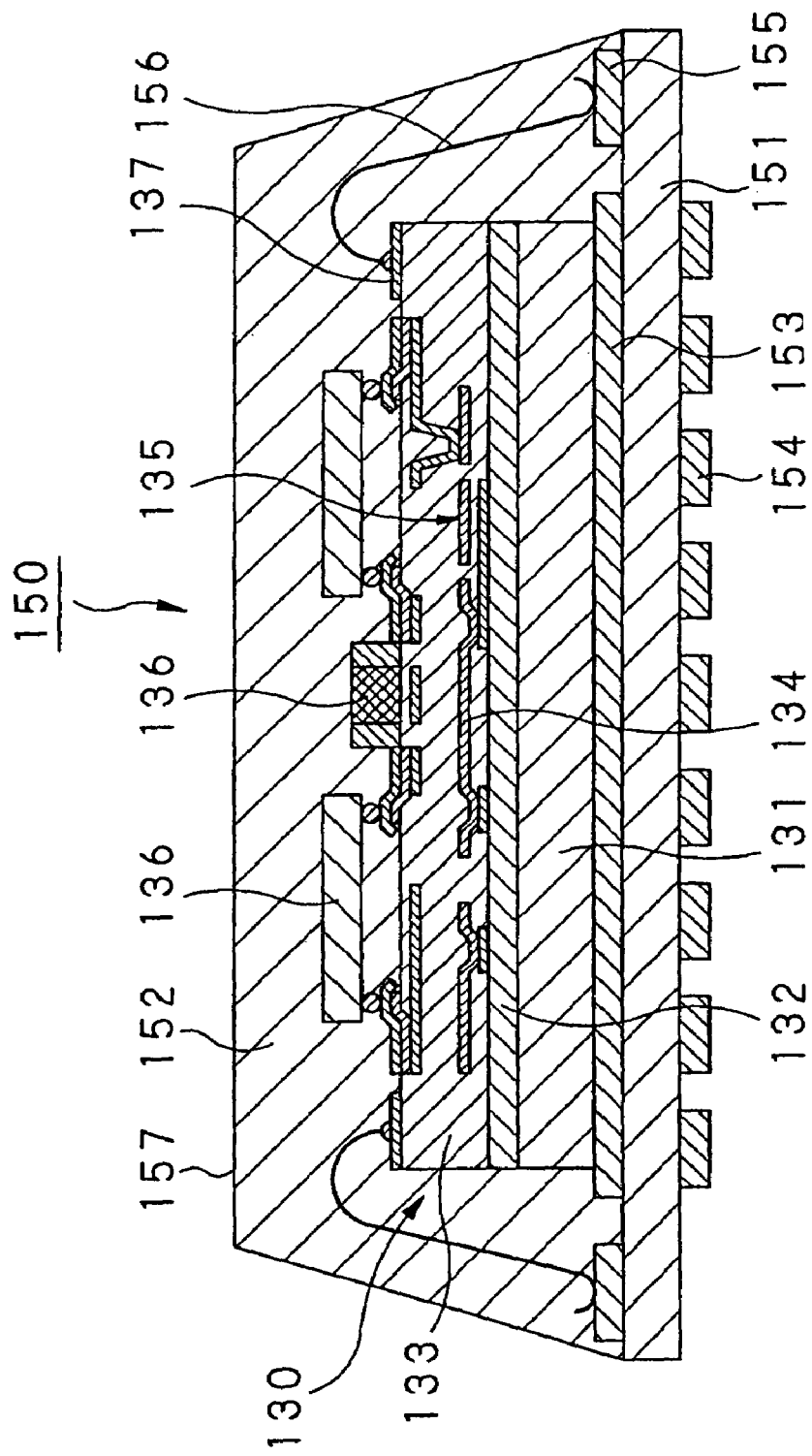
FIG. 6 is a longitudinally sectional view showing a package in which the high frequency module board device is mounted on an interposer board.

Now, embodiments of a high frequency module board device according to the present invention will be described in detail by referring to the drawings.

Figure 7:
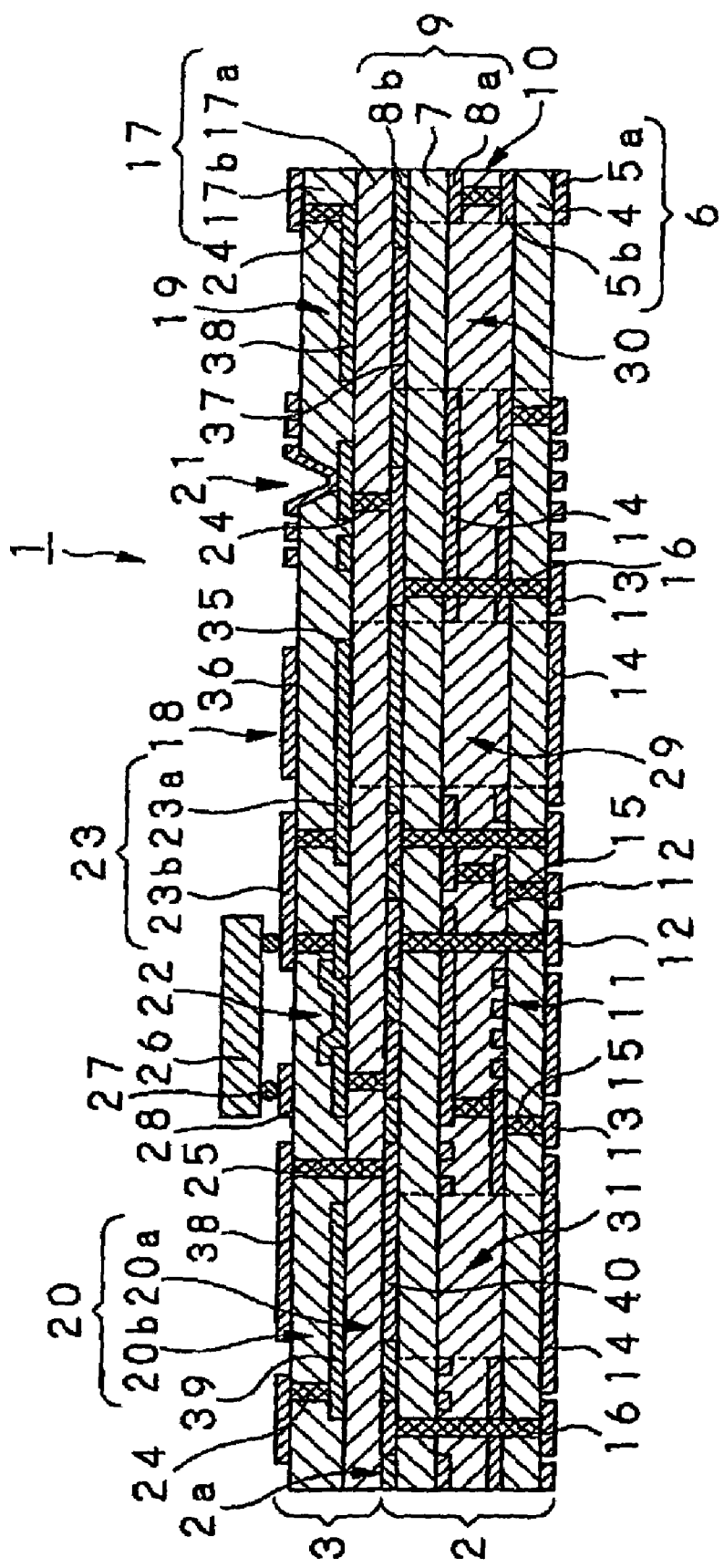
FIG. 7 is a sectional view showing one example of a high frequency module board device according to the present invention.

A high frequency module board device 1 according to the present invention shown in FIG. 7 has a package form for realizing a high density mounting structure to a mother board or an interposer board (intermediate board) and this device itself serves as one functional parts.

The high frequency module board device 1 according to the present invention comprises a base board 2, the uppermost layer of which is formed in a highly accurate flat surface as a build-up surface 2a, and a high frequency circuit part 3 built up thereon.

The base board 2 is a what is called a printed-wiring board. The baseboard 2 has a structure having a first wiring board 6 in which first and second wiring layers 5a and 5b are patterned on both the surfaces of a first core board 4 as a dielectric insulating layer. Further, the base board 2 has a second wiring board 9 in which third and fourth wiring layers 8a and 8b are patterned on both the surfaces of a second core board 7 as a dielectric insulating layer. The first wiring board 6 and the second wiring board 9 are bonded together through a prepreg material (adhesive resin) 10 serving as a dielectric insulating layer.

The first core board 4 and the second core board 7 of them are formed of a material having low dielectric constant and low Tan δ, that is, a material excellent in its high frequency characteristics, such as polyphenylene ether (PPE), bismaleimide triazine (BT-resin), polytetrafluoro ethylene, polyimide, liquid crystal polymer (LCP), polynorbornene (PNB), ceramic or a mixture of ceramic and an organic material, etc. For the first core board 4 and the second core board 7, for instance, an epoxy copper clad board FR-5 high in its mechanical strength, excellent in its heat resistance and chemical resistance and more inexpensive than a base material made of the above-described materials may be used.

On the first and second wiring layers 5a and 5b and the third and fourth wiring layers 8a and 8b, functional elements such as filters 11, signal wiring patterns 12 for connecting the functional elements together, power supply patterns 13 and ground patterns 14 are formed in thin films by, for instance, a copper foil. On the first and second wiring layers 5a and 5b and the third and fourth wiring layers 8a and 8b, passive elements such as capacitance, inductance, resistances, etc. or antenna patterns may be patterned.

The functional elements are electrically connected together through via holes 15 or through holes 16 made of, for instance, copper. The via holes 15 or the through holes 16 pass through the signal wiring patterns 12 for connecting the functional elements together, the power supply patterns 13 and the ground patterns 14, and the first core board 4 and the second core board 7. These via holes 15 or the through holes 16 are formed in such a way that holes passing through the base board 2 are partly bored on the base board 2 by drilling or laser beam machining and a via plating or a through hole plating is applied to the bored holes.

In the base board 2, the first wiring board 6 and the second wiring board 9 made of an inexpensive organic material are laminated by the same multi-layer forming technique as the conventional technique. Thus, a cost is reduced more than a case using a relatively expensive Si substrate or a glass substrate as in the prior art. This base board 2 is not limited to the above-described four-layer built up structure and the number of layers to be laminated is arbitrary. Further, the base board 2 is not limited to the base board formed by bonding the above-described double-sided wiring boards 6 and 9 together through the prepreg material 10. For instance, a structure that a copper foil with resin is laminated on both the main surface sides of double sided wiring boards may be used.

The base board 2 has its uppermost layer side, that is, the fourth wiring layer 8b side of the second core board 7 highly accurately flattened to form the build-up surface 2a. Specifically, after an insulating film made of an organic material excellent in its high frequency characteristics is formed over all the surface of the uppermost layer of the base board 2, the insulating film is ground until the fourth wiring layer 8b formed in this uppermost layer is exposed. Thus, in the base board 2, the insulating film is embedded between the wiring in the fourth wiring layer 8b. Thus, a step is eliminated from apart in which the fourth wiring layer 8b is not formed on the second core board 7 and the highly accurately flattened build-up surface 2a is formed on the uppermost layer.

In the high frequency circuit part 3, an insulating layer 17 is laminated on the build-up surface 2a of the base board 2. Passive elements, for instance, capacitance 18, 19 and 20, an inductance 21, a resistance 22, etc. and a wiring pattern 23 for connecting them together are patterned on the inner layer or the outer layer of the laminated insulating layer 17 by a thin film forming technique or a thick film forming technique.

The insulating layer 17 is formed by using a material having a low dielectric constant and low Tan δ, that is, a material excellent in its high frequency characteristics such as polyphenylene ether (PPE), bismaleimide triazine (BT-resin), polytetrafluoro ethylene (trade name: Teflon), polyimide, liquid crystal polymer (LCP), polynorbornene (PNB), ceramic or a mixture of ceramic and an organic material, etc. Then, the insulating layer 17 can be formed on the base board 2 with good accuracy by laminating such organic materials using a method excellent in application uniformity and film thickness control such as a spin coat method, a curtain coat method, a roll coat method, a dip coat method etc.

The passive elements or the wiring pattern 23 are electrically connected together through via holes 24 or through holes 25 made of, for instance, copper. These via holes 24 or the through holes 25 are formed in such a way as described below. Holes passing through the high frequency circuit part 3 are formed by partly boring holes in the high frequency circuit part 3 by drilling or laser beam machining and a via plating or a through hole plating is applied to the bored holes.

A semiconductor chip 26 is mounted on the uppermost layer of the high frequency circuit part 3 by a flip chip connection. Here, the flip chip connection is a mounting method that bumps 27 are formed on electrodes in the semiconductor chip 26 side and electrodes 28 on the wiring patter 23 of the high frequency circuit part 3 side are positioned on the bumps 27 with a front and a back inverted, heated and molten to connect them by the so-called face down bonding. According to this flip chip connection, a space in which wire is pulled around is not necessary as compared with wire bonding. Especially, height can be greatly decreased.

The passive elements and the semiconductor chip 26 formed on the high frequency circuit part 3 are electrically connected to the fourth wiring layer 8b of the base board 2 side through the wiring pattern 23, the via holes 24 and the through holes, 25.

In the high frequency module board device 1, the base board 2 is formed in multi-layers, so that the number of laminated layers in the high frequency circuit part 3 can be reduced. That is, in the high frequency module board device 1, for instance, the passive elements, the thin film pattern such as the wiring pattern 23, the via holes 24, the through holes 25, etc. are formed on the inner layer or the outer layer of the high frequency circuit part 3. In the inner layer or the outer layer of the base board 2, the functional elements or conductor patterns such as the signal wiring patterns 12 are formed separately from the above-described components. Thus, a burden of high density exerted on the high frequency circuit part 3 can be more greatly reduced as compared with a case in which the above-described components are collectively formed on the Si substrate or the glass substrate as in the prior art.

Accordingly, in the high frequency module board device 1 according to the present invention, the number of laminated layers of the high frequency circuit part 3 can be reduced to further miniaturize the entire part of the device and decrease a cost.

In the high frequency module board device 1, the conductor patterns of the above-described base board 2 are separated from the thin film pattern of the high frequency circuit part 3, so that an electrical interference generated between them can be suppressed to improve characteristics thereof.

Further, in the high frequency module board device 1 to which the present invention is applied, since the build-up surface 2a highly accurately flattened is formed in the uppermost layer of the base board 2, the high frequency circuit part 3 can be laminated thereon with good accuracy.

In the high frequency module board device 1 according to the present invention, areas 29, 30, and 31 in which the first and second wiring layers 5a and 5b and the third and fourth wiring layers 8a and 8b are not formed at the same positions in the direction of thickness (refer them to as areas having no wiring, hereinafter) are provided in the base board 2. These areas having no wiring 29 to 31 are provided at least from the fourth wiring layer 8b exposed on the build-up surface 2a of the base board 2 to a middle part in the direction of thickness, or pass through the base board 2. The capacitance 18 to 20 provided in the high frequency circuit part 3 are respectively provided just above the areas having no wiring 29 to 31.

Figure 8:
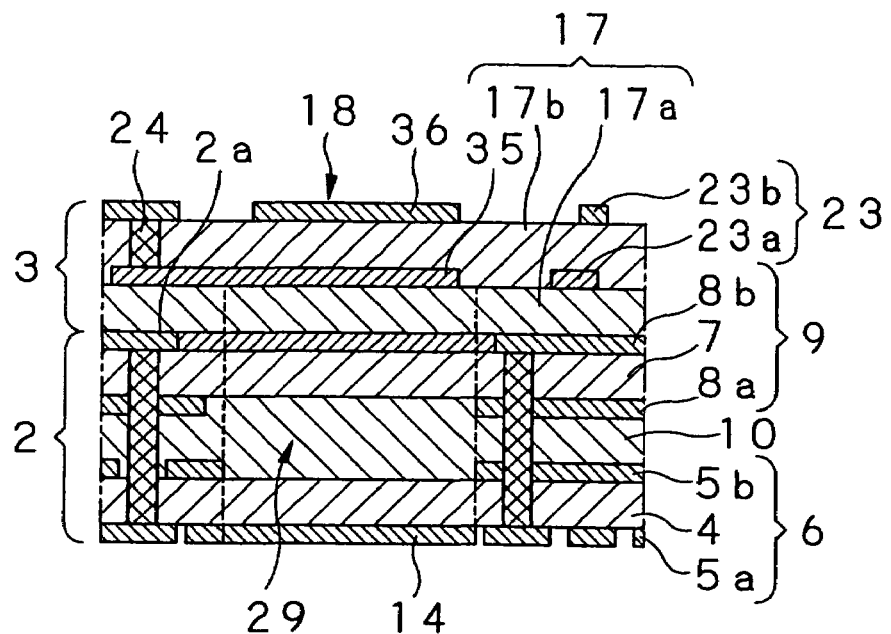
FIG. 8 is a main part sectional view showing a wiring inhibit area and a capacitance forming area in enlarged forms in the high frequency module board device according to the present invention.
Figure 9A:
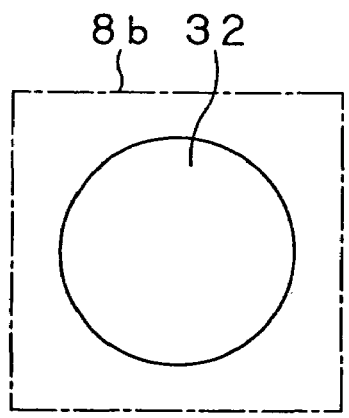
FIGS. 9A to 9D are plan views respectively showing structures of areas in which wiring is not formed in layers of a base board.
Figure 9B:
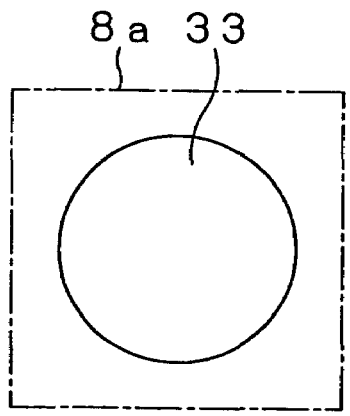
Figure 9C:
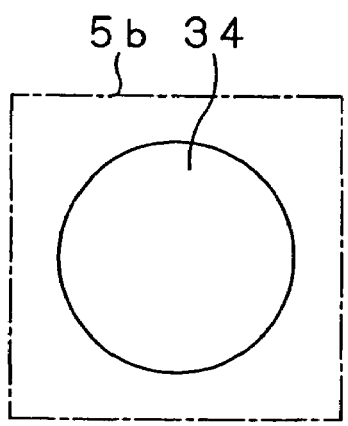

For instance, the area having no wiring 29 is provided, as shown in FIG. 8, in the direction of thickness from the fourth wiring layer 8b to the second wiring layer 5b in an area in which the capacitance 18 is formed. That is, in the fourth wiring layer 8b, as shown in FIGS. 8 and 9A, a first zone having no wiring 32 corresponding to the area in which the capacitance 18 is formed is provided. Further, in the third wiring layer 8a, as shown in FIGS. 8 and 9B, a second zone having no wiring 33 corresponding to the area in which the capacitance 18 is formed is provided. Further, in the second wiring layer 5b, as shown in FIGS. 8 and 9C, a third zone having no wiring 34 corresponding to the area in which the capacitance 18 is formed is provided.

Figure 9D:
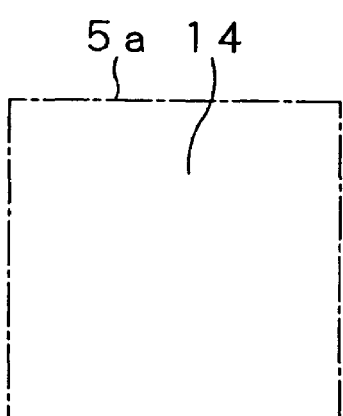

In the area having no wiring 29, as shown in FIGS. 8 and 9D, the ground pattern 14 formed on the first wiring layer 5a is opposed to the capacitance 18. The ground pattern 14 is spaced with a prescribed distance from the capacitance 18 through the first zone having no wiring 32, the second zone having no wiring 33 and the third zone having no wiring 34.

Another area having no wiring 30 is provided in the direction of thickness from the third wiring layer 8a to the first wiring layer 5a in an area in which the capacitance 19 is formed. In the base board 2, the ground pattern 14 to be opposed to the capacitance 19 is not provided. A still another area having no wiring 31 is provided in the direction of thickness from the third wiring layer 8a to the second wiring layer 5b in an area in which the capacitance 20 is provided. The ground pattern 14 formed in the first wiring layer 5a in the base board 2 is opposed to the capacitance 20.

As shown in FIG. 8, the capacitance 18 is formed in such a manner as described below. A lower electrode part 35 is located in the inner layer or the outer layer of the insulating layer 17 of the high frequency circuit part 3 and formed in a part of a first wiring pattern 23a adjacent to the build-up surface 2a. An upper electrode part 36 is formed in a part of a second wiring pattern 23b of a second layer counted from the build-up surface 2a. A second insulating layer 17b of a second layer counted from the build-up surface 2a is interposed between the lower electrode part 35 and the upper electrode part 36. The capacitance 18 is electrically connected to the wiring pattern 23 through the via hole 24.

In order to form this capacitance 18, a first insulating layer 17a made of the above-described organic material is firstly formed on the build-up surface 2a. Then, after an electrically conductive film made of, for instance, Ni, copper, etc. is formed over the entire surface of the first insulating layer 17a, the electrically conductive film is etched through a photoresist patterned to a prescribed form as a mask by using a photolithography technique. Thus, the substrate layer (not shown) of the first wiring pattern 23a in which the lower electrode 35 is patterned is formed just above the area having no wiring 29. Then, an electrically conductive film made of Cu having about several m is formed by an electrolytic plating using, for instance, copper sulfate solution to form the first wiring pattern 23a having the lower electrode part 35.

Subsequently, the second insulating layer 17b made of the above-described organic material is formed on the first insulating layer 17a so as to cover the first wiring patter 23a having the lower electrode part 35. Then, the insulating layer is etched through a photoresist patterned to a prescribed form as a mask by using the photolithography technique to form a via (hole) a part of which connected to a part near the end part of the lower electrode 35 is exposed. Then, while the photoresist is left, after an electrically conductive film made of Cu is formed by an electrolytic plating process using, for instance, copper sulfate solution, the photoresist is removed together with the electrically conductive film accumulated on the photo resist. Thus, the via hole 24 embedded in the second insulating layer 17b is electrically connected to the lower electrode part 35.

Subsequently, an electrically conductive film made of, for instance, Ni, copper, etc. is formed all over the second insulating layer 17b. Then, this electrically conductive film is etched through a photoresist patterned to a prescribed form as a mask by using the photolithography technique. Thus, a substrate layer (not shown) of the second wiring pattern 23b is formed in which the upper electrode part 36 is patterned just above the lower electrode part 35. Then, an electrically conductive film made of Cu having about several μm is formed by an electrolytic plating using copper sulfate solution to pattern and form the second wiring pattern 23b having the upper electrode part 36 on the substrate layer. In such a manner, the capacitance 18 is formed.

As described above, in the high frequency module board device 1, the area having no wiring 29 of the base board 2 is provided at least from the build-up surface 2a of the base board 2 to the second wiring layer 5b throughout the middle part in the direction of thickness. Further, in the high frequency module board device 1, the capacitance 18 of the high frequency circuit part 3 is formed just above the area having no wiring 29.

In the high frequency module board device 1 to which the present invention is applied, an adequate distance can be provided between the capacitance 18 and the ground pattern 14. Parasitic capacity generated by the ground pattern 14 is reduced relative to the capacitance 18, so that the characteristics of the capacitance 18 can be improved.

Figure 10:
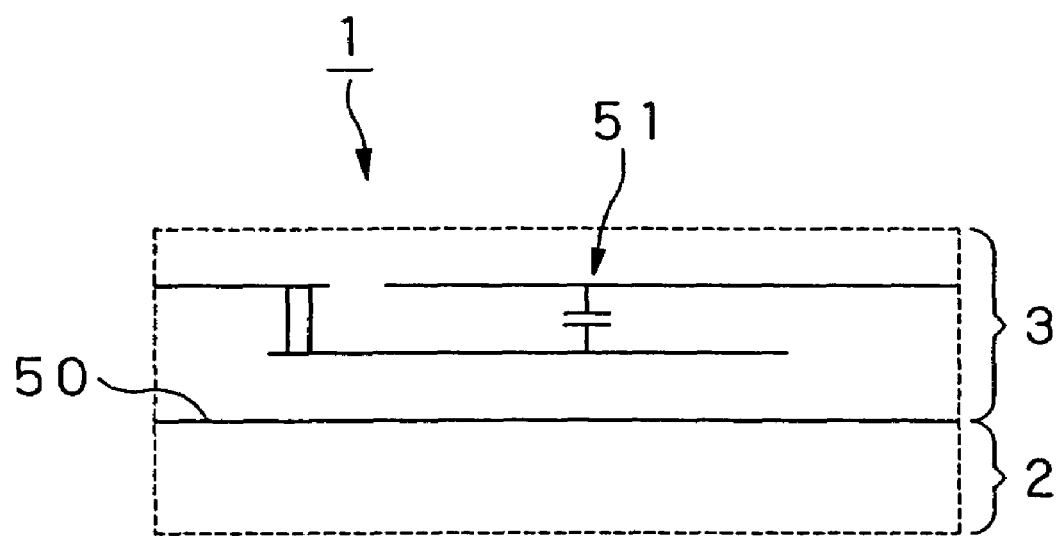
FIG. 10 is a schematic view showing a capacitance formed just above the ground pattern.
Figure 11:
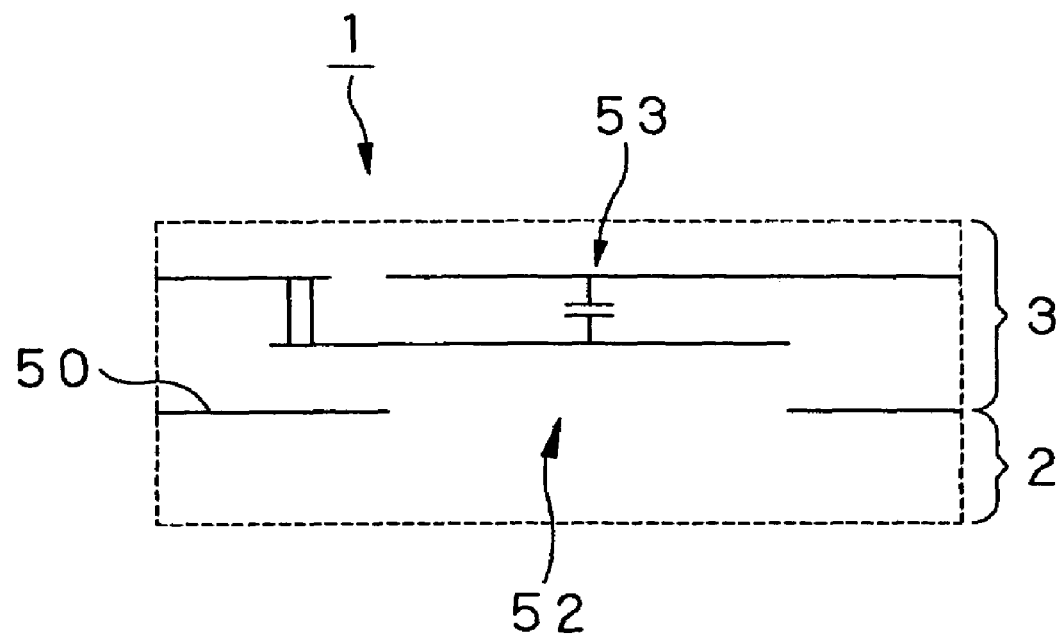
FIG. 11 is a schematic view showing the capacitance formed just above the area in which the wiring is not formed.

Now, capacitance 51 is formed just above a ground pattern 50 shown in FIG. 10 as in the prior art and capacitance 53 is formed just above an area having no wiring 52 shown in FIG. 11 as in the present invention. As for the capacitance 51 and 53, while changing frequency, capacities between ports were measured. In FIGS. 10 and 11, structures and elements common to those of the above-described high frequency module device 1 are designated by the same reference numerals and a detailed description of them is omitted.

Figure 12:
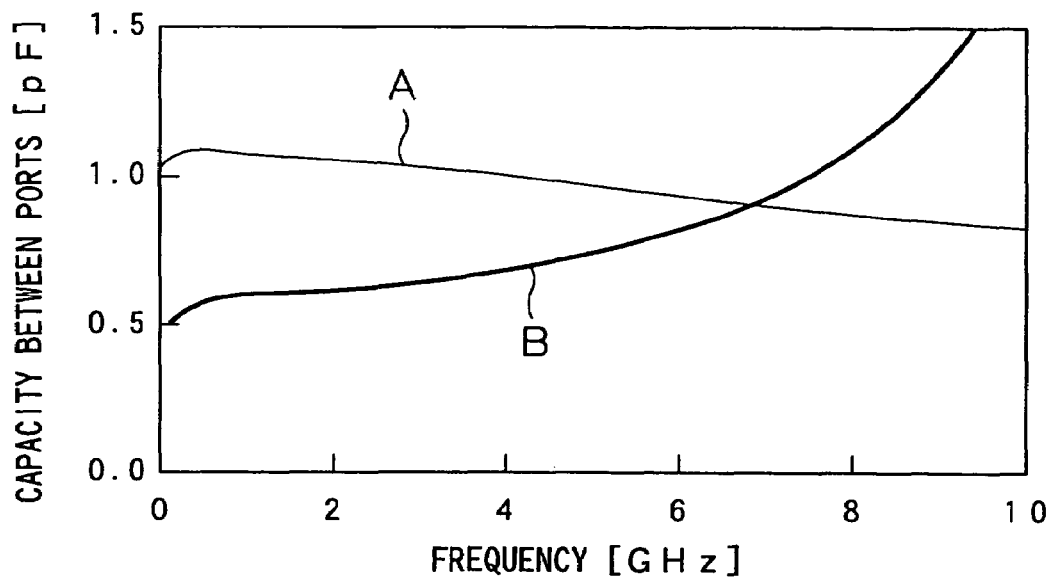
FIG. 12 is a characteristic view showing the relation between the capacities of ports and frequencies in the capacitance formed on the area in which the wiring is not formed and the capacitance formed in the ground pattern.

Results obtained by measuring the relations between the frequencies and the capacities between ports are shown in FIG. 12. In FIG. 12, an axis of ordinate shows a capacity between ports and an axis of abscissa shows frequency. The capacity between ports shows a value of electrostatic capacity between electrode parts forming the capacitance.

As apparent from the measured results of FIG. 12, when the capacitance 51 is formed just above the ground pattern 50 as in the prior art, a parasitic capacity is generated between the ground pattern 50 and the electrodes forming the capacitance 51 adjacent to the ground pattern 50. As shown by A in FIG. 12, the electrostatic capacity of the capacitance 51 is loaded with the parasitic capacity to increase the capacity between ports.

On the contrary, when the capacitance 53 is formed immediately above the area having no wiring 52 as in the present invention, a parasitic capacity is not generated between the ground pattern 50 and the capacitance 53. As apparent from B in FIG. 12, the capacity between ports is suppressed to a value half or less than the above-described capacity between ports in an area where a frequency band is relatively low such as 1 GHz.

Accordingly, the capacitance 53 formed just above the area having no wiring 52 can obtain excellent high frequency characteristics in a relatively low frequency band.

Figure 13:
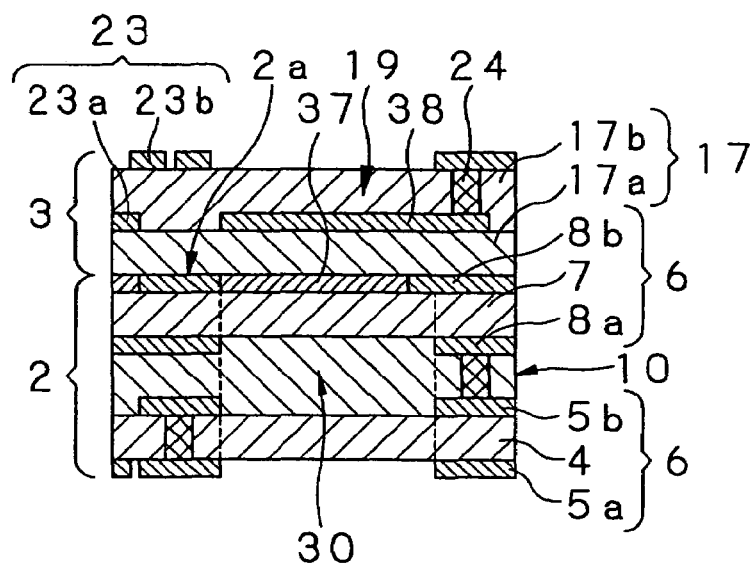
FIG. 13 is a main part sectional view showing a wiring inhibit area and a capacitance forming part in enlarged forms in the high frequency module board device according to the present invention.

Now, as shown in FIG. 13, the capacitance 19 formed in such a way as described below will be described. A lower electrode part 37 is formed on a part of the fourth wiring layer 8b in the base board 2 and an upper electrode part 38 is formed on a part of the first wiring pattern 23a in the high frequency circuit part 3. The first insulating layer 17a is interposed between the lower electrode part 37 and the upper electrode part 38. The capacitance 19 is electrically connected to the wiring pattern 23 through the via hole 24.

When this capacitance 19 is formed, the first insulating layer 17a made of the above-described organic material is firstly formed on the build-up surface 2a on which the fourth wiring layer 8b having the lower electrode part 37 formed is exposed just above the area having no wiring 30. Then, after an electrically conductive film made of, for instance, Ni, copper, etc. is formed over the entire surface of the first insulating layer 17a, the electrically conductive film is etched through a photoresist patterned to a prescribed form as a mask by using a photolithography technique. Thus, the substrate layer (not shown) of the first wiring pattern 23a in which the upper electrode part 38 is patterned is formed just above the lower electrode part 37. Then, an electrically conductive film made of Cu having about several μm is formed by an electrolytic plating using, for instance, copper sulfate solution to form the first wiring pattern 23a having the upper electrode part 38.

Subsequently, a second insulating layer 17b made of the above-described organic material is formed on the first insulating layer 17a so as to cover the first wiring patter 23a having the upper electrode part 38. Then, the insulating layer is etched through a photoresist patterned to a prescribed form as a mask by using the photolithography technique to form a via (hole) a part of which connected to a part near the end part of the upper electrode part 38 is exposed. Then, while the photoresist is left, after an electrically conductive film made of Cu is formed by an electrolytic plating process using, for instance, copper sulfate solution, the photoresist is removed together with the electrically conductive film accumulated on the photoresist. Thus, the via hole 24 embedded in the second insulating layer 17b is electrically connected to the upper electrode part 38.

Subsequently, an electrically conductive film made of, for instance, Ni, copper, etc. is formed all over the second insulating layer 17b. Then, this electrically conductive film is etched through a photoresist patterned to a prescribed form as a mask by using the photolithography technique. Thus, a substrate layer (not shown) of a second wiring pattern 23b is formed. Then, an electrically conductive film made of Cu having about several μm is formed by an electrolytic plating using copper sulfate solution to form the second wiring pattern 23b electrically connected to the via hole 24. In such a manner, the capacitance 19 is formed.

As described above, in the high frequency module board device 1, the area having no wiring 30 of the base board 2 is provided to pass through the base board 2 in the direction of thickness at least from the third wiring layer 8a of the base board 2. Further, in the high frequency module board device 1, the capacitance 19 of the high frequency circuit part 3 is formed just above the area having no wiring 30.

In the high frequency module board device 1, the ground pattern 14 that interferes with the capacitance 19 does not exist and parasitic capacity generated thereby is greatly reduced relative to the capacitance 19, so that the characteristics of the capacitance 19 can be improved.

Figure 14:
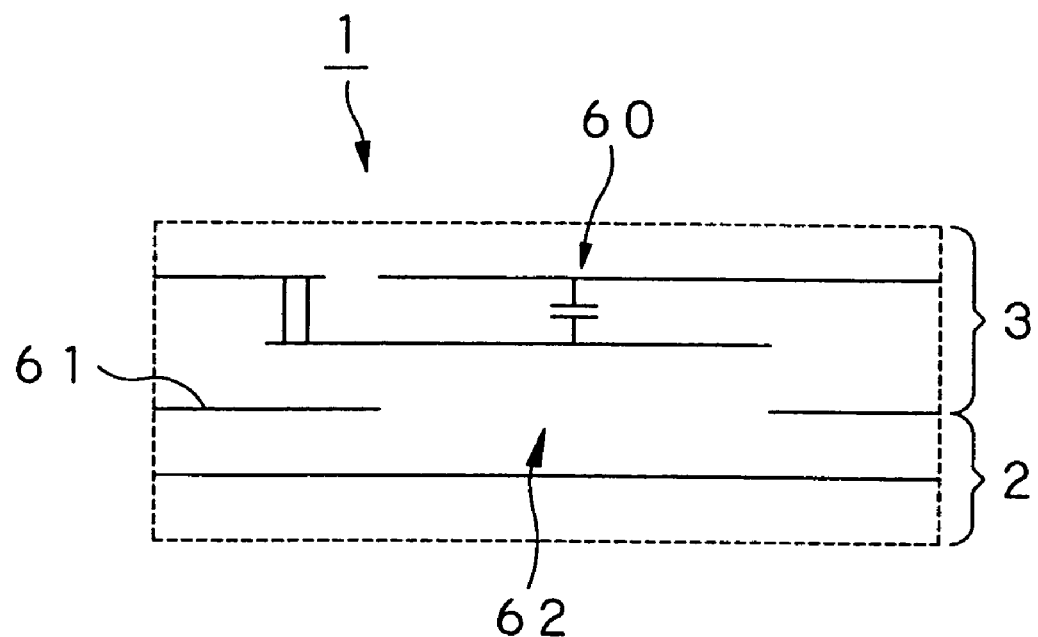
FIG. 14 is a schematic view showing a capacitance formed just above an area in which wiring is not formed that is formed only on a ground pattern adjacent to the capacitance.
Figure 15:
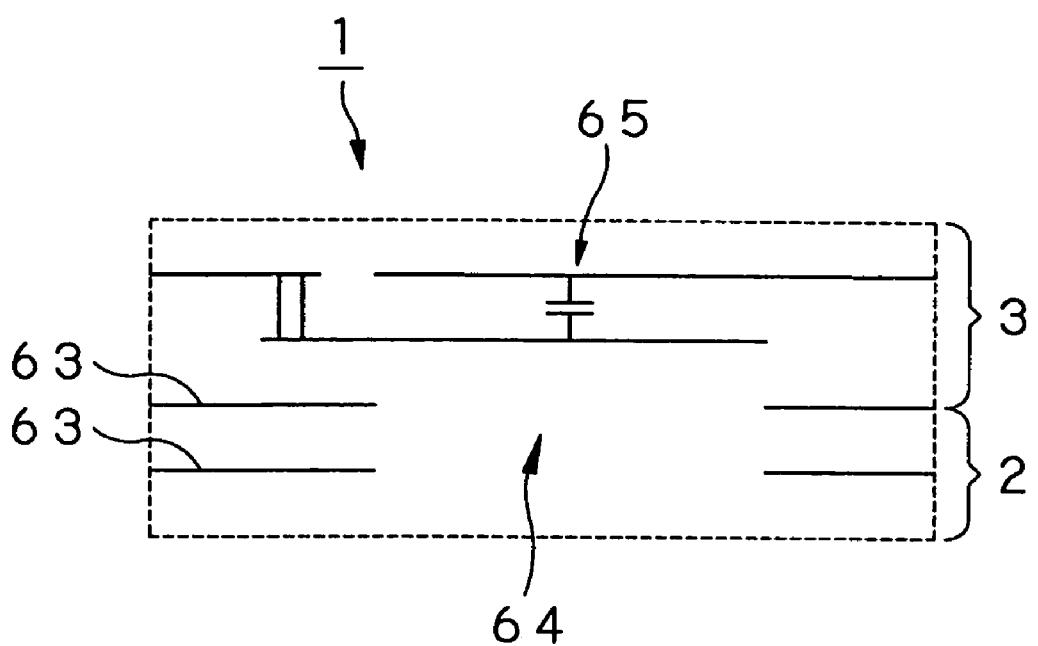
FIG. 15 is a schematic view showing a capacitance formed just above an area in which wiring is not formed that is formed on all ground patterns in lower layers.

Now, capacitance 60 is formed just above an area having no wiring 62 formed only in a ground pattern 61 adjacent to capacitance 60 as sown in FIG. 14. Capacitance 65 is formed just above an area having no wiring 64 formed on the entire parts of ground patterns 63 as lower layers shown in FIG. 15. As for the capacitance 60 formed just above the area having no wiring 62 and the capacitance 65 formed just above the area having no wiring 64, while changing frequency, capacities between ports were measured. In FIGS. 14 and 15, the description of the same structures and parts as those of the above-described high frequency module board device 1 is omitted and they are designated by the same reference numerals in the drawings.

Figure 16:
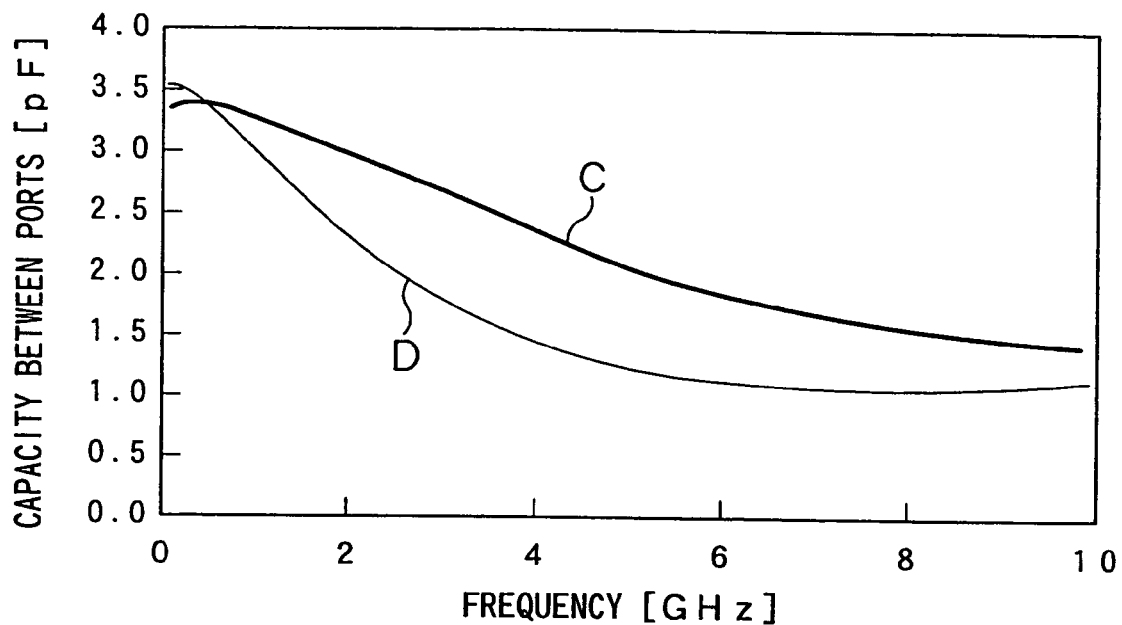
FIG. 16 is a characteristic view showing the relation between capacities of ports and frequencies in the capacitance formed just above the area in which the wiring is not formed that is formed only in the ground pattern adjacent to the capacitance and the capacitance formed just above the area in which the wiring is not formed that is formed on all the ground patterns in the lower layers.

Results obtained by measuring the relations between the frequencies and the capacities between ports are shown in FIG. 16. In FIG. 16, an axis of ordinate shows a capacity between ports and an axis of abscissa shows frequency. The capacity between ports shows a value of electrostatic capacity between electrode parts forming the capacitance.

As apparent from the measured results of FIG. 16, the capacitance 65 formed just above the area having no wiring 64 formed on all the ground patterns 63 as the lower layers shows characteristics shown by C in FIG. 16. According to the characteristics of the capacitance 65, a parasitic capacity generated between the capacitance and the ground patterns 63 is more reduced than the characteristics of the capacitance 60 formed just above the area having no wiring 62 formed only in the ground pattern 61 adjacent to the capacitance 60, that is, characteristics shown by D in FIG. 16. Thus, it is understood that the capacity between ports is suppressed in an area in which a frequency band is relatively high.

Accordingly, the capacitance 65 formed just above the area having no wiring 64 formed on all the ground patterns 63 as the lower layers can obtain excellent high frequency characteristics in a relatively low frequency band.

Figure 17:
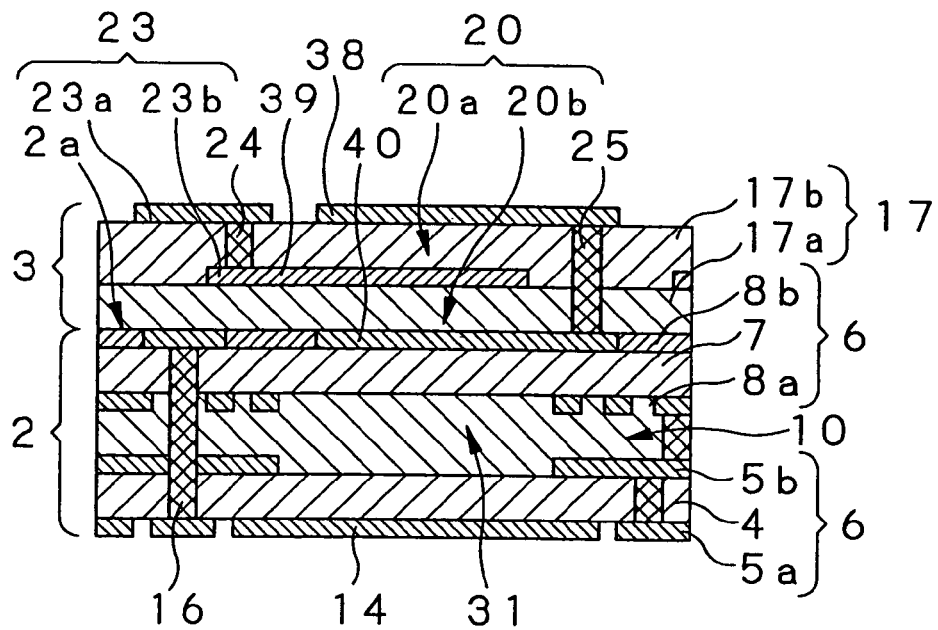
FIG. 17 is a main part sectional view in which a capacitance forming part with a three-layer structure of wiring inhibit areas and electrode parts is shown in an enlarged form.

Now, as shown in FIG. 17, the capacitance 20 having a three-layer structure of electrode parts will be described below. The capacitance 20 includes a first capacitance 20a and a second capacitance 20b. A first capacitance 20a is formed that a second insulating layer 17b is interposed between an upper electrode part 38 formed on a part of a first wiring pattern 23a in the high frequency circuit part 3 and an intermediate electrode part 39 formed in a part of a second wiring pattern 23b. A second capacitance 20b is formed that a first insulating layer 17a is interposed between the intermediate electrode part 39 and a lower electrode part 40 formed on a part of a fourth wiring layer 8b in the base board 2. In the capacitance 20, the upper electrode part 38 is interconnected to the lower electrode part 40 through a through hole 25 and the intermediate electrode part 39 is electrically connected to the wiring pattern 23 through a via hole 24.

When this capacitance 20 is formed, the first insulating layer 17a made of the above-described organic material is firstly formed on the build-up surface 2a on which the fourth wiring layer 8b having the lower electrode part 40 formed is exposed just above the area having no wiring 31. Then, an etching process is carried out through a photoresist patterned to a prescribed form as a mask by using a photolithography technique to form a via (hole) a part of which connected a part near the end part of the lower electrode part 40 is exposed. Then, while the photoresist is left, after an electrically conductive film made of Cu is formed by an electrolytic plating process using, for instance, copper sulfate solution, the photoresist is removed together with the electrically conductive film accumulated on the photoresist. Thus, an intermediate body of the through hole 25 embedded in the first insulating layer 17a is electrically connected to the part near the end part of the lower electrode part 40.

Subsequently, an electrically conductive film made of, for instance, Ni, copper, etc. is formed all over the first insulating layer 17a. Then, this electrically conductive film is etched through a photoresist patterned to a prescribed form as a mask by using the photolithography technique. Thus, a substrate layer (not shown) of the first wiring pattern 23a on which the intermediate electrode part 39 is patterned is formed just above the lower electrode part 40. Then, an electrically conductive film made of Cu having about several μm is formed by an electrolytic plating using copper sulfate solution to pattern and form the first wiring pattern 23a having the intermediate electrode part 39 on the substrate layer. In such a manner, the first capacitance 20a is formed.

Subsequently, a second insulating layer 17b made of the above-described organic material is formed on the first insulating layer 17a so as to cover the first wiring patter 23a having the intermediate electrode part 39. Then, the insulating layer is etched through a photoresist patterned to a prescribed form as a mask by using the photolithography technique. Thus, a via (hole) is formed having an exposed part in which the intermediate body of the through hole is connected to the part near the end part of the intermediate electrode part 39. Then, while the photoresist is left, after an electrically conductive film made of Cu is formed by an electrolytic plating process using, for instance, copper sulfate solution, the photoresist is removed together with the electrically conductive film accumulated on the photoresist. Thus, the via hole 24 embedded in the second insulating layer 17b and the through hole 25 passing through the insulating layer 17 are formed.

Subsequently, an electrically conductive film made of, for instance, Ni, copper, etc. is formed all over the second insulating layer 17b. Then, this electrically conductive film is etched through a photoresist patterned to a prescribed form as a mask by using the photolithography technique. Thus, a substrate layer (not shown) of a second wiring pattern 23b on which the upper electrode part 38 is patterned just above the intermediate electrode part 39 is formed. Then, an electrically conductive film made of Cu having about several μm is formed by an electrolytic plating using, for instance, copper sulfate solution to form the second wiring pattern 23b having the upper electrode part 38 on the substrate layer. Thus, the second capacitance 20b is formed. In such a way, the capacitance 20 the electrode part of which has the three-layer structure is formed.

As described above, in the high frequency module, board device 1, the area having no wiring 31 of the base board 2 is provided throughout the intermediate part at least from the third wiring layer 8a to the second wiring layer 5b of the bass board 2 in the direction of thickness. Further, in the high frequency module board device 1, the capacitance 20 of the high frequency circuit part 3 is formed just above the area having no wiring 31.

Accordingly, in the high frequency module board device 1, the capacitance 20 can be adequately separated from the ground pattern 14. A parasitic capacity generated by the ground pattern 14 can be reduced relative to the capacitance 20. Thus, the characteristics of the capacitance 20 can be improved.

In this high frequency module board device 1, the electrode part of the capacitance 20 has the three-layer structure. Accordingly, an area in which the capacitance 20 having an electrostatic capacity larger than that of the capacitance having the electrode part of the two-layer structure is formed can be made equal to or reduced more than an area of the capacitance having the electrode part of the two-layer structure.

Figure 18:
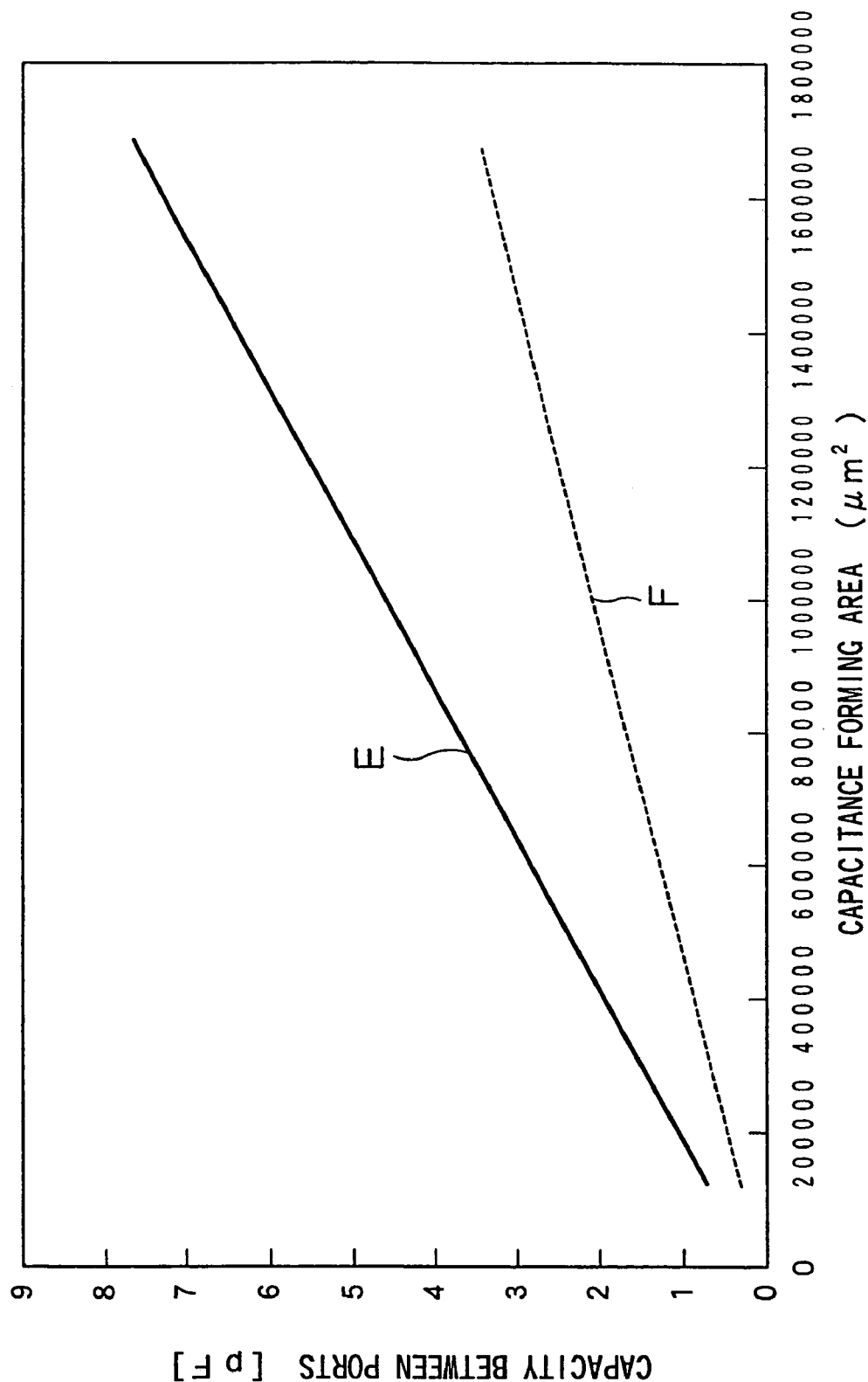
FIG. 18 is a characteristic view showing the relation between capacities of ports and capacitance forming areas in a capacitance having a three-layer structure of electrode parts and a capacitance having a two-layer structure of electrode parts.

Now, the relations between capacitance forming areas and capacities between ports in the capacitance having the electrode part of the three-layer structure and the capacitance having the electrode part of the two-layer structure are shown in FIG. 18. In FIG. 18, an axis of ordinate shows a capacity between ports and an axis of abscissa shows a capacitance forming area. Here, the capacity between ports indicates a value of electrostatic capacity between electrode parts forming the capacitance.

As apparent from the measured results shown in FIG. 18, the capacitance having the electrode part of the three-structure has the higher capacity between ports relative to the area in which the capacitance is formed as shown by E of FIG. 18 than the capacity between ports of the capacitance having the electrode part of the two-layer structure shown by F in FIG. 18.

Consequently, in the capacitance having the electrode part of the three-layer structure, the area in which the capacitance is formed can be reduced more than that of the capacitance having the electrode part of the two-layer structure which has the same electrostatic capacity.

As described above, in the high frequency module board device 1, the characteristics of the capacitance 18, 19 and 20 can be more improved and a more miniaturization and a lower cost can be realized.

INDUSTRIAL APPLICABILITY

As described above, according to the high frequency module board device of the present invention, the capacitance is located just above the area having no wiring of the base board. The parasitic capacity generated by the wiring layers of the base board is reduced relative to the capacitance. Therefore, the characteristics of the capacitance can be improved. The high frequency module board device comprises the base board and the high frequency circuit part in which the insulating layers and the wiring layers are formed in multi-layers. The passive elements or the like can be formed in the base board and the high frequency circuit part, so that the device itself can be miniaturized at low cost.

We claim:

1. A high frequency module board device comprising:
a base board comprising a plurality of wiring layers, with an insulating layer between adjacent wiring layers wherein an upper-most wiring layer of the base board provides a build-up surface; and
an insulating layer formed over said base board; and
a high frequency circuit part having two or more wiring layers with an insulating layer formed between each wiring layer, formed over the build-up surface of the base board;
wherein the base board has an area in which wiring is not formed at least at a portion of the upper-most wiring layer located directly below a location at which the height frequency circuit part has a capacitance formed, the capacitance being formed such that an upper electrode and a lower electrode are formed at positions respectively corresponding to the area in which the wiring is not formed, said high frequency module board further comprising at least one ground pattern.

2. A high frequency module board device comprising:
a base board comprising a plurality of wiring layers, with an insulating layer between adjacent wiring layers wherein an upper-most wiring layer of the base board provides a build-up surface; and
an insulating layer formed over said base board; and
a high frequency circuit part having one or more wiring layers with an insulating layer between each wiring layer formed over the build-up surface of the base board;
wherein the base board has an area in which wiring is not formed at least at a portion of the second wiring layer located directly below a location at which the high frequency module board has a portion of a capacitance formed, the capacitance being formed such that an upper electrode is formed in the high frequency circuit part at a position above the build-up surface corresponding to the area in which the wiring is not formed and a lower electrode is formed in the base board at a position of the upper-most wiring layer corresponding to the area in which the wiring is not formed, said high frequency module board further comprising at least one ground pattern.

3. A high frequency module board device comprising:

a base board comprising a plurality of wiring layers, with an insulating layer between adjacent wiring layers wherein an upper-most wiring layer of the base board provides a build-up surface; and an insulating layer formed over said base board; and a high frequency circuit part having two or more wiring layers with an insulating layer between each wiring layer, formed over the build-up surface of the base board;

wherein the base board has an area in which wiring is not formed at least at a portion of the second wiring layer located directly below a location at which the high frequency circuit part has a first capacitance formed, the capacitance being formed such that an upper electrode and a lower electrode are formed in the high frequency part at positions above the build-up surface respectively corresponding to the area in which the wiring is not formed, said high frequency module board further comprising at least one ground pattern, and a second capacitance formed in such a way that a third electrode is formed in the base board at a position of the upper-most wiring layer corresponding to the area in which the wiring is not formed and the third electrode is interconnected to the upper electrode of the first capacitance.

* * * * *